(12) United States Patent
Delevoye et al.

(10) Patent No.: US 7,504,820 B2
(45) Date of Patent: Mar. 17, 2009

(54) CURRENT SENSOR WITH ALTERNATING MAGNETIC EXCITATION

(75) Inventors: Elisabeth Delevoye, Grenoble (FR); Marc Beranger, St. Martin d'Uriage (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 11/831,349

(22) Filed: Jul. 31, 2007

(65) Prior Publication Data

US 2008/0048643 A1  Feb. 28, 2008

(30) Foreign Application Priority Data

Jul. 31, 2006  (FR) .................................. 06 53209

(51) Int. Cl.
*G01R 15/18* (2006.01)
(52) U.S. Cl. ................................. 324/117 R
(58) Field of Classification Search ............. 324/117 R, 324/117 H, 126, 127, 158.1, 765, 763, 253, 324/130, 133
See application file for complete search history.

(56) References Cited

U.S. PATENT DOCUMENTS

| 5,831,424 | A | 11/1998 | Jensen |
| 6,310,470 | B1 * | 10/2001 | Hebing et al. ........... 324/117 R |
| 6,417,661 | B1 * | 7/2002 | Berkcan et al. ......... 324/117 R |

FOREIGN PATENT DOCUMENTS

| EP | 0 356 171 A2 | 2/1990 |
| EP | 1 542 025 A1 | 6/2005 |

OTHER PUBLICATIONS

Toshikatsu Sonoda, et al., "An AC and DC Current Sensor of High Accuracy", IEEE Transactions on Industry Applications, XP 000311409, vol. 28, No. 5, Sep. 1, 1992, pp 1087-1093.
Toshikatsu Sonoda, et al., "A Current Sensor of High Response and High Sensitivity", IEEE, XP 010034835, vol. 2, Oct. 7, 1990, pp. 626-631.
Ljubomir A. Kojovic, "PCB Rogowski Coil Designs and Performances for Novel Protective Relaying", IEEE Power Engineering Society General Meeting, vol. 2, Jul. 13-17, 2003, pp. 609-614.

(Continued)

*Primary Examiner*—Ha Tran T Nguyen
*Assistant Examiner*—Tung X Nguyen
(74) *Attorney, Agent, or Firm*—Oblon, Spivak, McClelland, Maier & Neustadt, P.C.

(57) ABSTRACT

A current measurement device includes a current sensor including a magnetic circuit, a plurality of windings including at least one excitation winding charged with the excitation of the magnetic circuit, and at least one detection winding. The sensor is equipped with windings forming a transformer of which at least one primary winding opposite the magnetic circuit through which a current I to be measured is designed to enter, and at least one secondary winding opposite the magnetic circuit capable of producing a counter reaction magnetic field.

15 Claims, 7 Drawing Sheets

OTHER PUBLICATIONS

Eric Favre, et al., "Current Sensing in Electric Drives a Future and History Based on Multiple Innovations", 6$^{TH}$ Symposium on Advanced Electromechanical Motion Systems, 7 Pages.

Eric Favre, et al., "Capteurs De Courant : A Chacun Son Argument", Mesures Electriques, 763, Mar. 2004, pp. 49-54, (with Partial English Translation).

Vincent Frick, et al., "CMOS Microsystem for AC Current Measurement With Galvanic Isolation", IEEE Sensors Journal, vol. 3, Issue 6, Dec. 2003, pp. 752-760.

Fraunhofer Institute, System Integration on Flex, http://www.pb.izm.fhg.de/avt/010_groups/020, 1 Page.

* cited by examiner

CURRENT SENSOR WITH ALTERNATING MAGNETIC EXCITATION

BACKGROUND OF THE INVENTION

1. Field of the Invention

This invention relates to the field of current measurement, and relates to a current measurement device equipped with an improved current sensor with variable magnetic excitation, to measure a direct or alternating current. The current measurement device of the invention comprises, on a same support, excitation and detection windings, as well as at least one winding that the current to be measured is designed to pass through. The invention applies to the field of microelectronics and micro-technologies and provides for the production of a micro current sensor, that is robust as concerns voltage surges, and which has improved performances especially as concerns the bandwidth, the dissipated power and immunity to environmental electromagnetic interferences.

2. Description of the Related Art

There are many different techniques for measuring an electrical current. In particular, resistance isolation technologies may be used, for which the measurement of the current is indirect and carried out by the detection of a magnetic field created by this current. The measurement of a high current may be especially made using a shunt or a current transformer, whose role is to adapt the high current to be measured to a component. Another method that is traditionally used is the ampere metric magnetic cell clip, for example the "Hall effect" type, or the "fluxgate" type, or the "Rogowski" type. The type of sensor used to measure electrical current will be chosen according to the specific needs of the application, such as:

the measurement range, the peak or efficient value of the current maximal to be measured, the accuracy and/or resolution desired, the bandwidth, the maximum frequency, the measurement or not of the direct current.

A shunt can be assimilated to an accurate low value resistor. The current to be measured passes through this resistor and causes a voltage drop to its terminals, which is transmitted to a signal processing device such as for example an analogue/digital converter. The precision resistor generally comprises 4 terminals to avoid unwanted parasite effects of the connections. A shunt may comprise two terminals to connect the current circuit, and two junction terminals to measure the voltage drop. The shunt allows direct current measurements to be made, but has in particular a bandwidth limited to several kHz typically, and introduces interference.

A current transformer generally comprises a "primary winding" and a "secondary winding" around a magnetic circuit. A current that is to be measured runs through the primary which has a given number $N_1$ of spires of high cross section, generally a single spire, whereas the secondary has a number $N_2$ of spires of low cross section. Such a type of sensor stands up well to voltage surges or short-circuits and has a bandwidth that may extend for example from 50 Hz to 50 kHz. The transformer sensors however have the disadvantage of not permitting a direct current to be measured.

A current clip device is generally formed by a magnetic circuit that may be open, a magnetic sensor, for example of the Hall effect type and a counter reaction winding. The clip surrounds a conductor or a set of conductors through which, a current that is to be measured, passes. With such a device, the measurement is made entirely without any contact and without physical connection to the conductor through which the current to be measured passes.

As concerns the current clip devices, there are specific current clips for "Rogowski" type sensors that are not equipped with a magnetic circuit. The document: "*PCB Rogowski coil designs and performances for novel protective relaying*" Kojovic, Power Engineering Society General Meeting, IEEE Volume 2, 13-17 Jul. 2003, presents such a type of sensor. One or several coils are coupled to the conductor though which passes the current to be measured, and enables a voltage to be induced. With such a type of sensor, the measurement offset and gain depend on many physical and geometrical parameters such as the size of the air gap, the relative position of the sensor in the air gap, the centring of the conductor in the clip, the permeability of the magnetic circuit, the proximity of any possible magnetic objects, the amplitude and the direction of external interfering magnetic fields.

The fluxgate is a very sensitive magnetic field sensor, whose bandwidth extends from continuous to several dozen kHz. The sensor fluxgate comprises, around a magnetic circuit with very high magnetic permeability, an excitation coil and a detection coil. The excitation coil saturates the magnetic circuit alternatively under a positive and negative field. The detection coil is sensitive to an imbalance between the positive and negative field. This imbalance is caused by an external source, for example the magnetic earth field in the case of a field sensor. In the case of a current clip with fluxgate sensor, the imbalance is caused by the current to be measured flowing in a central conductor. The conductor in which flows the current to be measured and the sensor form two elements that are independent or that are not in contact. In one such device, the measurement performances depend on the control of the relative position of the sensor with respect to the conductor. Furthermore, the distance between the conductor of the current to be measured is around one millimeter and is difficult to reduce to a very low value.

There is consequently the problem of finding a new current sensor device, which does not have the disadvantages mentioned above.

SUMMARY OF THE INVENTION

The invention relates to a current measurement device equipped with at least one current sensor comprising:

a magnetic circuit, a plurality of windings opposite the magnetic circuit including at least one excitation winding charged with the excitation of the magnetic circuit, at least one "current" winding, that a current I to be measured is designed to pass through and designed to produce a given magnetic, at least one detection winding.

The sensor may possibly operate in open loop in the case of the information measured concerning the detection of a drop to zero of the current.

In one embodiment, the sensor may comprise at least one "counter reaction" winding, designed to produce a counter reaction magnetic field opposing the given magnetic field. The current measurement device is in this case likely to operate in a closed loop.

In one first possible embodiment, the detection winding may be the counter reaction winding.

In one second possible embodiment, the detection winding and the counter reaction winding may be separate windings.

The current sensor may comprise at least one first winding comprising a first plurality of conductive zones located opposite the magnetic circuit and connected to one another in parallel, and at least one second winding, capable of being coupled by magnetic coupling to the first winding, and comprising a second plurality of conductive zones located opposite the magnetic circuit and connected to one another in series.

In one possible embodiment, at least several conductive zones of the first plurality of conductive zones may be located opposite respectively one or be respectively superimposed on one, conductive zone of the same surface belonging to the second plurality of conductive zones.

The current measurement device of the invention is capable of adopting a first configuration called the "high current measurements" in which said first winding is the "current" winding and in which said second winding is the "counter reaction" winding.

The current measurement device of the invention is capable of adopting a second configuration called the "low current measurement" in which said first winding is the "counter reaction winding" and in which said second winding is the "current winding". in these two configurations, the counter reaction current is equal to the current to be measured multiplied by a transformation ratio.

The current measurement device may further comprise: switching means capable of placing the current measurement device in the first configuration or in the second configuration and of passing the current measurement device from the first configuration to the second configuration or from the second configuration to the first configuration.

In one possible embodiment, the magnetic circuit of the sensor may be formed by at least one first magnetic core and at least one second magnetic core parallel at the first core.

The layout of the excitation winding may be provided so as to produce a first excitation field component in a given direction at the first core and a second excitation field component in the same direction at the second core.

The excitation winding may comprise a plurality of conductive zones located opposite the magnetic circuit and connected to one another in series.

The layout of the detection winding may be provided to carry out a differential measurement between a magnetic field at the first core and a magnetic field at the second core.

The detection winding may be formed by a plurality of conductive rings connected to one another, wherein the magnetic circuit is located inside at least several of said rings.

The current measurement device of the invention may further comprise: a counter reaction electronic circuit connected to the detection winding and capable of supplying a counter reaction current to the counter reaction winding.

The current measurement device of the invention may further comprise: an excitation circuit capable of supplying an excitation signal at the input of the excitation winding.

In one advantageous embodiment, the excitation circuit may comprise means which generate pulses capable of emitting the excitation signal at the input of the excitation winding in the form of a succession of pulses.

The current measurement device may further comprise a conductor from which the current I to be measured comes or is designed to come from, connected in series to the sensor.

The invention relates to a microelectronic device comprising a device as defined above.

The invention includes the advantages of the shunt type sensors and the current transformer type. The sensor of the invention permits direct currents to be measured in contrast with transformers. The device of the invention has a high bandwidth which may be from continuous to several hundred kHz, a very low dissipated power, and is very robust as concerns voltage surges.

BRIEF DESCRIPTION OF THE DRAWINGS

This invention will be easier to understand after reading the description of embodiments, provided purely by way of example and in no way restrictively, in reference to the appended drawings in which.

The various parts shown in the figures are not necessarily to a uniform scale, to make the figures easier to read.

DETAILED DESCRIPTION OF THE PREFERRED EMBODIMENTS

Figure 1:
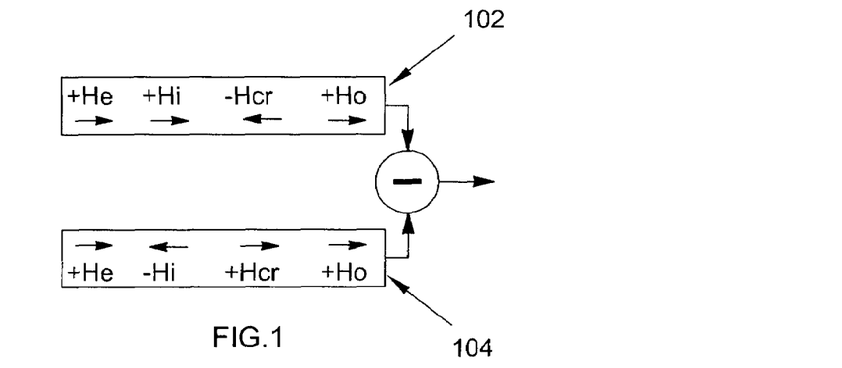
FIG. 1 illustrates an operating principle of an electrical current measurement device which is an embodiment of the invention.

One operating principle of a current measurement device of the invention, will now be provided in relation to FIG. 1. The device comprises a current sensor equipped with a magnetic circuit and several windings made on a same support, for example on a microelectronic substrate. In this description, the term coil or winding is not restricted to a set of spires forming a solenoid. We will call coil or winding throughout this description, a set of conductive elements connected to one another and capable of producing a magnetic field.

The magnetic circuit may be formed by one or several magnetic cores, for example by a first magnetic core 102 and a second magnetic core 104, for example in the form of two parallel arms. The current measurement device further comprises, as in a fluxgate type device, excitation means (not shown) comprising at least one excitation winding charged with the excitation of the magnetic circuit and integrated into the sensor. Excitation means are provided to saturate the magnetic circuit in an alternating excitation field, for example alternatively positive and negative. The excitation winding may be connected to an excitation circuit capable of supplying an excitation current in the form for example of an alternating current, or advantageously, of a succession of current pulses with alternatively opposed signs. The layout of the excitation winding as concerns the magnetic circuit is such that one component of the excitation field +He is capable of being generated at the first core 102, and that one component of the excitation field +He substantially of the same intensity and same direction is capable of being generated at the second core 104.

The current measurement device also comprises detection means (not shown) equipped with at least one receiver or detection winding integrated into the current sensor. The detection winding is formed by a plurality of conductive elements connected in series, spaced out along the cores 102, 104. The detection winding is laid out so that a measurement differential between the magnetic field components at the core 102, and the magnetic field components at the core 104, may be made. The excitation field He and the external field Ho for example equal to the earth field plus one component linked to the environment of the sensor, cancel one another out and do not unbalance the arms of the magnetic circuit. The sensor is thus not sensitive to the magnetic earth field and to the environmental interferences.

The current sensor is also equipped with at least one "current winding" (not shown) through which a current I that is to be measures, is designed to pass. The passage of the current I in the "current winding" permits a magnetic field called the "primary magnetic field" to be produced. The current winding is laid out so that one component +Hi of the primary field is capable of being generated at the first core 102, and that one component −Hi of the primary field substantially of the same intensity and opposite direction is capable of being generated at the second core 104.

The sensor may be provided to operate in a closed loop. The output signal may be reinjected into means forming a counter reaction, provided to produce a counter reaction magnetic field Hcr opposing the primary magnetic field, so as to operate with no field.

The means forming a counter reaction may comprise at least one counter reaction winding integrated into the sensor. The counter reaction magnetic field is caused by the passage of a counter reaction current in the counter reaction winding, wherein the counter reaction current is equal to the current to be measured multiplied by a transformation ratio. The "current" and "counter reaction" windings are capable of forming a transformer. Among the windings forming the sensor, at least one first winding is formed by a plurality of conductive elements in series located opposite the magnetic circuit, and is magnetically coupled to at least one second winding formed by a plurality of conductive elements in parallel located opposite the magnetic circuit.

In one first possible configuration of the current measurement device, adapted to a high current measurement for example between 10 mA and 10 A, the first winding of the sensor formed by a plurality of conductive elements connected in parallel, may act as the "current winding", wherein the second winding formed by a plurality of conductive elements in series, acts as the "counter reaction winding". In this case, the winding formed by a plurality of conductive elements connected in parallel, may form the primary winding of a transformer, wherein the other winding formed by a plurality of conductive elements in series, forms the secondary winding of the transformer. In this configuration, the conductive elements or conductive arms of the "current winding", respectively receive a current $I_j$ equal to one portion or a subdivision of the current I to be measured. The signals generated by each subdivision of current are superimposed in the conductive elements of the detection winding which are in series. The output signal of the detection winding is proportional in small signals to the current total to be measured.

In one second possible configuration of the current measurement device, adapted to a low current measurement for example between 100 nA and 100 mA, the first winding, formed by a plurality of conductive elements in parallel may act as the "counter reaction winding", wherein the second winding formed by a plurality of conductive elements in parallel, acts as the "current winding". with a same sensor, we can thus measure a wide range of currents for example between 100 nA and 10 A with a very good resolution.

Switching means may be provided to place the current measurement device in the first configuration or in the second configuration and to switch from the first configuration to the second configuration or vice versa. The switching means may comprise static relays, electro-mechanical switches or EMMS (electromechanical Microsystems).

The current sensor of the invention applies to the microtechnologies field and may be made in miniature form, for example using thin layer manufacturing techniques and/or those used in microelectronics. In this case, the current sensor will be called micro-sensor.

One example of a micro current sensor of the invention, in the first configuration called "high current measurements", will now be provided in relation to FIGS. 2A to 2E (showing the sensor in top views) and 3A to 3D (showing the sensor in transversal cross sectional views).

In this example, the micro sensor is equipped with a magnetic circuit, and 4 independent windings 110, 120, 140, 160, made on a same support, which may be a substrate 100, for example a semi-conductor, covered by a stack 101 of thin layers. The magnetic circuit is formed by a first magnetic core 102 with a given main direction and a second magnetic core 104 with a main direction parallel to that of the first core 102 (wherein the main direction of the first core 102 and of the second core 104 are defined by a direction parallel to the vector $\vec{i}$ of an orthogonal identifier $[O; \vec{i}; \vec{j}; \vec{k}]$). The first core 102 and the second core 104 are located in a same plane parallel to the main plane of the substrate (wherein the main plane of the substrate is defined as a plane, passing through the substrate and parallel to the plane $[O; \vec{i}; \vec{j}]$). The first magnetic core 102 and the second magnetic core 104 may be for example in the form of parallelepipedic blocks based on a magnetic material, for example FeNi, resting on a layer of dielectric material, for example $SiO_2$. The cores 102 and 104 have a respective length (measured in a direction parallel to the vector $\vec{i}$), which may be for example between 100 μm and 10000 μm or of around 1000 μm. The respective width of the cores 102 and 104 (measured in a direction parallel to the vector $\vec{j}$) may be for example between 10 μm and 1000 μm, or of around 100 μm. The cores 102 and 104 have a respective thickness (measured in a direction parallel to the vector $\vec{k}$) which may be for example between 0.1 μm and 50 μm, or between 1 μm and 5 μm. In one possible embodiment, the cores 102, 104 may be separate or disjointed or not be connected to one another. To reduce the external field gradient between the two cores and provide better resistance to interfering fields, the two cores 102 and 104 may be separated at most by several tens of micrometers. In one variant (not shown), the magnetic circuit of the sensor may be closed, wherein the cores 102 and 104 are connected to one another. The minimum distance between the windings 110, 120, 140, 160, and cores 102, 104 may be around 1 micrometer or less than 1 micrometer.

Figure 2A:
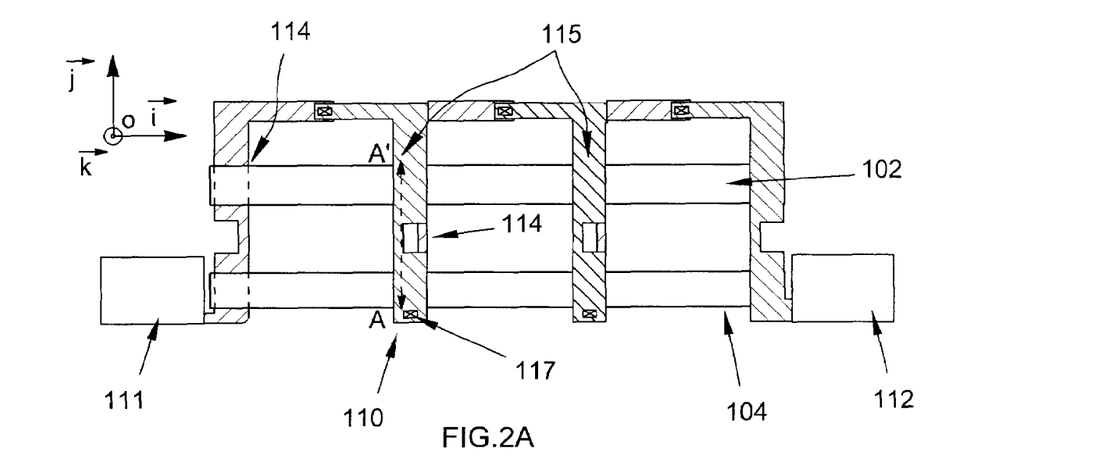
FIGS. 2A-2E, show, in a top view, the windings of an example of a current measurement micro sensor of the invention in a high current measurement configuration.
Figure 2B:
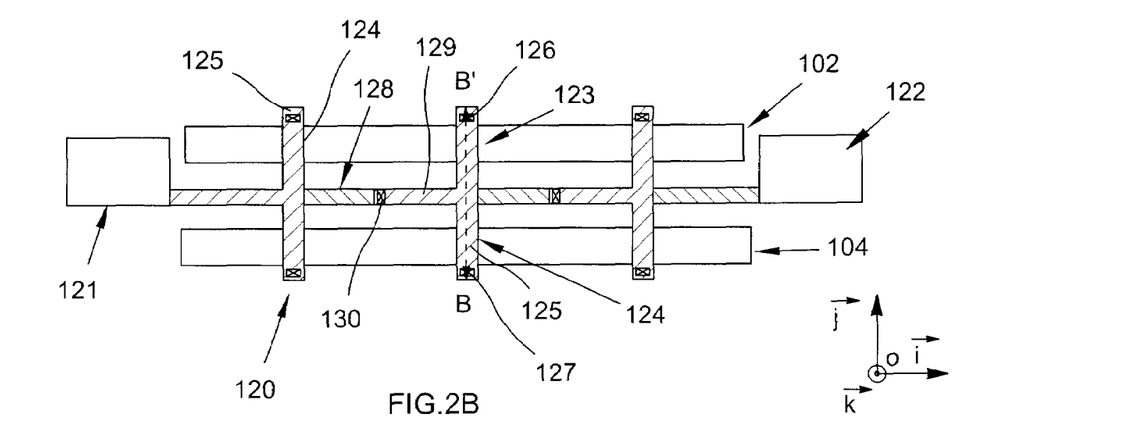
Figure 3A:
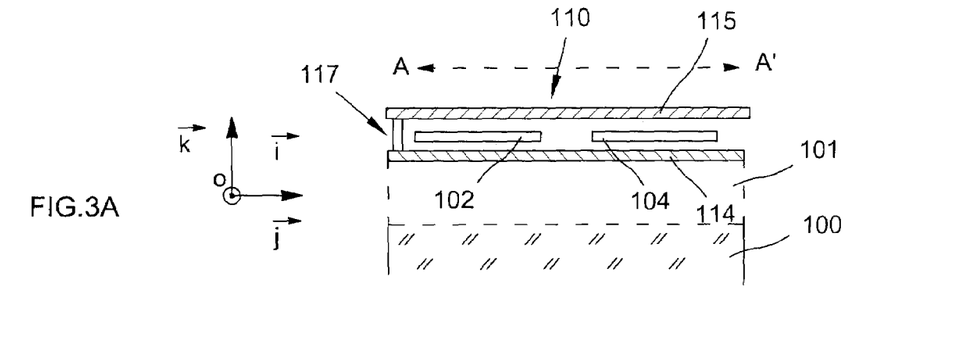
FIGS. 3A-3D show, in a cross sectional view, the windings of an example of a current measurement micro sensor of the invention in a high current measurement configuration.
Figure 3B:
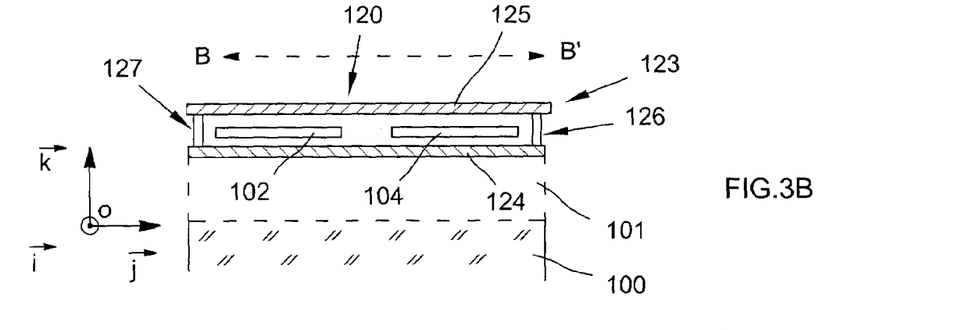

The micro current sensor is firstly equipped with an excitation winding 110 (FIGS. 2A and 3A, wherein the other windings 120, 140, 160 are not shown in these figures). The excitation winding 110 is connected to an excitation circuit 210 (shown in FIG. 2E) by means of connection pins 111, 112. The excitation circuit 210 may be provided to supply an excitation signal in the form of a sinusoidal signal or a square or triangular signal, or advantageously a succession of current pulses, for example alternatively positive and negative. The excitation winding 110 is provided so that, when it receives an excitation signal from the excitation circuit 210, it produces a magnetic excitation field and saturates the cores 102, 104. The excitation winding 110 may be formed by a succession of conductive elements, fitted in series along the cores 102 and 104. The layout of the excitation winding 110 is provided so that an excitation field component is designed to be produced at the first core 102, and that a component of the excitation field substantially of the same intensity and same direction is designed to be produced at the second core 104. The excitation winding 110 comprises flat conductive zones 114 located opposite the first core 102 and the second core 104 and resting in a first plane located between the substrate 100 and the cores 102, 104. The excitation winding 110 also comprises flat conductive zones 115 located opposite the first core 102 and the second core 104 and resting in a second plan, wherein the second plane is such that the cores 102, 104 are placed between the first plane and the second plane (FIG. 3A showing a transversal cross sectional view A'A shown in FIG. 2A). The layout of the winding 110 may be such that the flat conductive zones 114 resting in the first plane are connected respectively to at least one flat conductive zone 115 resting in the second plan, by means of at least one vertical interconnection or a metallised via 117. The excitation winding 110 may also be such that apart from the flat conductive zones connected to the connection pins 111, 112, the flat conductive zones 114 resting in the first plane are each connected and superimposed on a flat conductive zone 115 resting in the second plane. This layout may permit rapid saturation of the cores 102, 104 to be obtained by passing, opposite the cores 102, 104, current layers with parallel and opposite directions.

The micro current sensor is also equipped with a detection winding 120 (FIGS. 2B and 3B, wherein the other windings 110, 140, 160 are not shown in these figures) connected to an electronic detection and counter reaction circuit 220 (shown in FIG. 2E) by means of connection pins 121, 122. The electronic detection circuit 220 may comprise means forming an amplifier and means forming an integrator. The detection winding is laid out such that a differential measurement or detection between the fields produced at the first core 102, and the fields produced at the second core 104, may be made. The detection winding 120 is formed by a succession of conductive contours 123 or conductive rings 123 surrounding the cores 102, 104 and connected to one another, in series along the cores 102 and 104. The conductive contours 123 may be each formed by two half-contours of equal dimensions, wherein a first conductive half-contour surrounds the first core 102 and a second conductive half-contour surrounds the second core 104. A conductive contour 123 (shown in FIG. 3B in a transversal cross sectional view B'B shown in FIG. 2B) of the detection winding 120 may be formed by a first flat conductive zone 124 located in the first plane and opposite the cores 102, 104, by a second flat conductive zone 125 located in the second plane and opposite the cores 102, 104, by a first vertical interconnection 126 connecting the first flat conductive zone 124 to the second flat conductive zone 125, as well as a second vertical interconnection 127 connecting the first flat conductive zone 124 to the second flat conductive zone 125. The cores 102 and 104 are located between the first interconnection 126 and the second interconnection 127 on the one hand, and between the first flat conductive zone 124 and the second flat conductive zone 125 on the other. The conductive contours 123 of the detection winding 120 may be connected to one another by means of a first connection 128 parallel to the main direction of the cores located between the cores 102, 104, in the first plane and a second connection 129, parallel to the main direction of the cores, and located between the cores 102, 104, and in the second plane. The first connection 128 and the second connection 129 may be connected to one another by means of a vertical interconnection or via 130 located between the cores 102, 104. The detection winding 120 is laid out such that a current arriving at one of said conductive contours is split into two current components between the two half-contours forming the contour conductor 123. A current passing through the detection winding 120 is split synchronously between said two half-contours around the first core 102 and the second core 104.

Figure 2C:
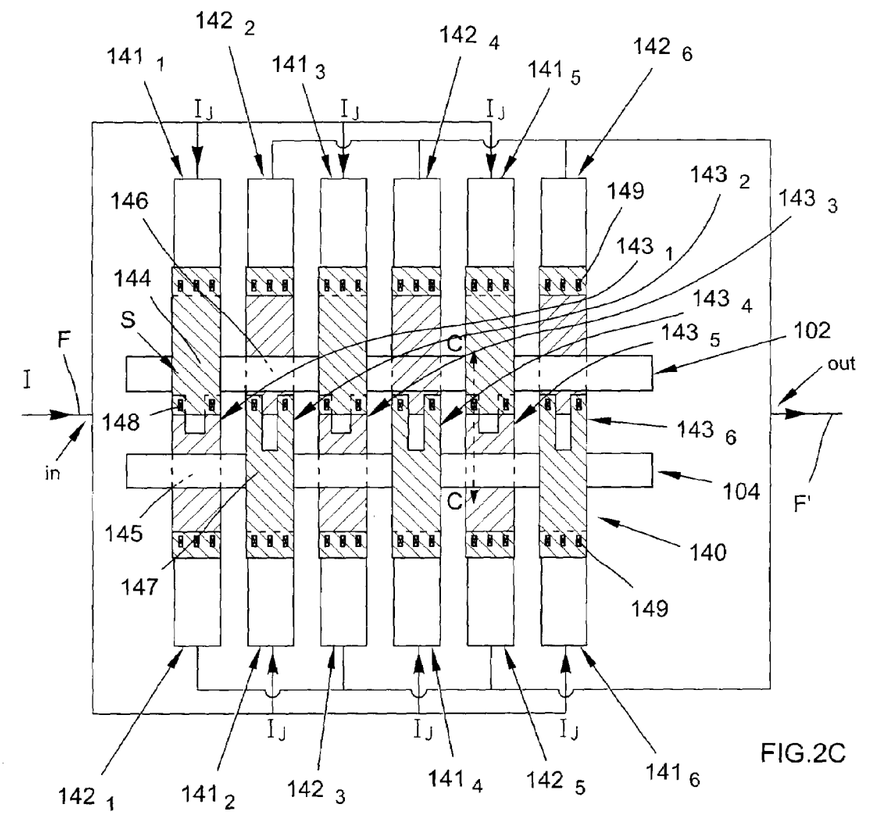
Figure 3C:
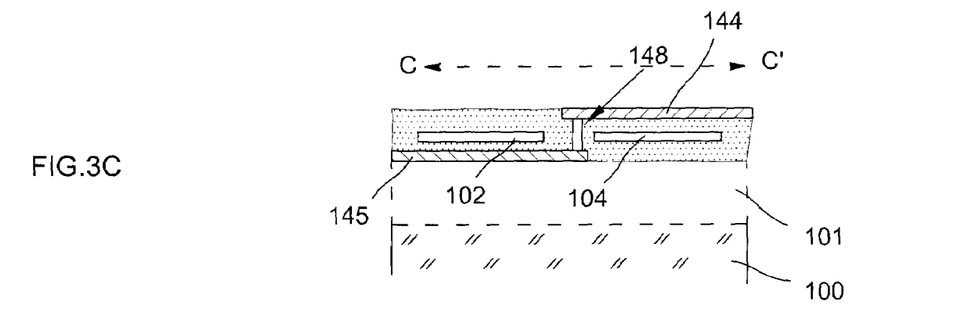

The micro current sensor also comprises a winding 140 (FIGS. 2C and 3C, wherein the other windings 110, 120, 160 are not shown) formed by a plurality of conductive elements or conductive arms $143_1, \ldots, 143_6$ connected or connected to one another in parallel, and positioned along the cores 102 and 104. The conductive arms $143_1, \ldots, 143_6$ may be formed respectively by a flat conductive zone passing opposite the first core 104 and located in one of said first or second planes, wherein the flat conductive zone is connected, for example by means of one or several vias 148 to another flat conductive zone passing opposite the second core 104 and located in the other of said second or first planes (FIG. 3C showing a transversal cross sectional view C'C shown in FIG. 2C of the winding 140). The winding 140 may be formed along the cores 102, 104, by a succession of conductive arms $143_1, \ldots, 143_6$, alternatively comprising a conductive arm formed by a first flat conductive zone 144 passing opposite the first core 104 and located in the second plane connected to another flat conductive zone 145 passing opposite the second core 104 and located in the first plane, and one conductive arm formed by a third flat conductive zone 146 passing opposite the first core 102 located in the first plane and connected to a fourth flat conductive zone 147 passing opposite the second core 104 and located in the second plane. Due to the layout of the flat conductive zones, the conductive arms $143_1, \ldots, 143_6$ are respectively provided to create a first elementary magnetic field at the first core and at the second core, a second elementary magnetic field substantially equal to the first elementary magnetic field, but in the opposite direction. The conductive arms $143_1, \ldots, 143_6$ may be respectively connected to an input pin and an output pin by means of one or several vias 149.

In the high current measurement configuration, the winding 140 acts as the "current winding", and is connected by means of a plurality of input conductor pins $141_1, \ldots, 141_6$ to one conductive zone F, that may be a wire, or a line, or a conductive track or a connector to which a current I to be measured is designed to be brought. The input conductor pins $141_1, \ldots, 141_6$ are electrically connected or connected to one another. The current I to be measured is designed to be divided between the conductive arms $143_1, \ldots, 143_6$ of the current winding 140. A parallel layer of subdivisions of the current to be measured is created which passes completely through the sensor. The conductive arms $143_1, \ldots, 143_6$ are designed to receive respectively one fraction Ij of the current I that we want to measure. A plurality of output conductor pins $142_1, \ldots, 142_6$, electrically connected to one another are also provided. In the high current measurement configuration, the winding 140 is capable of forming the primary winding of a transformer.

Figure 2D:
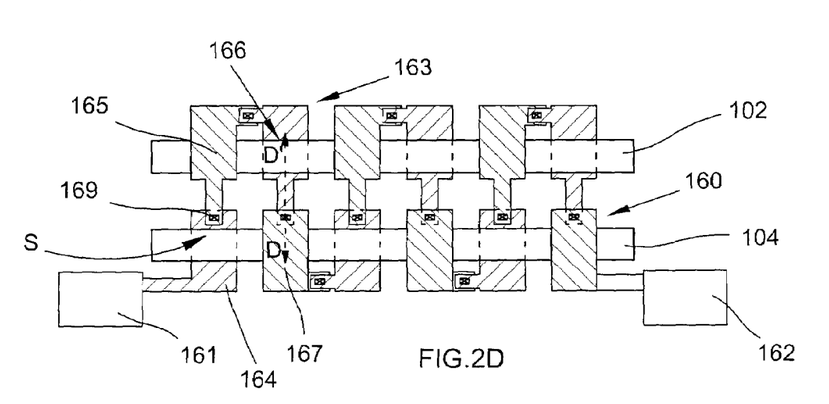
Figure 2E:
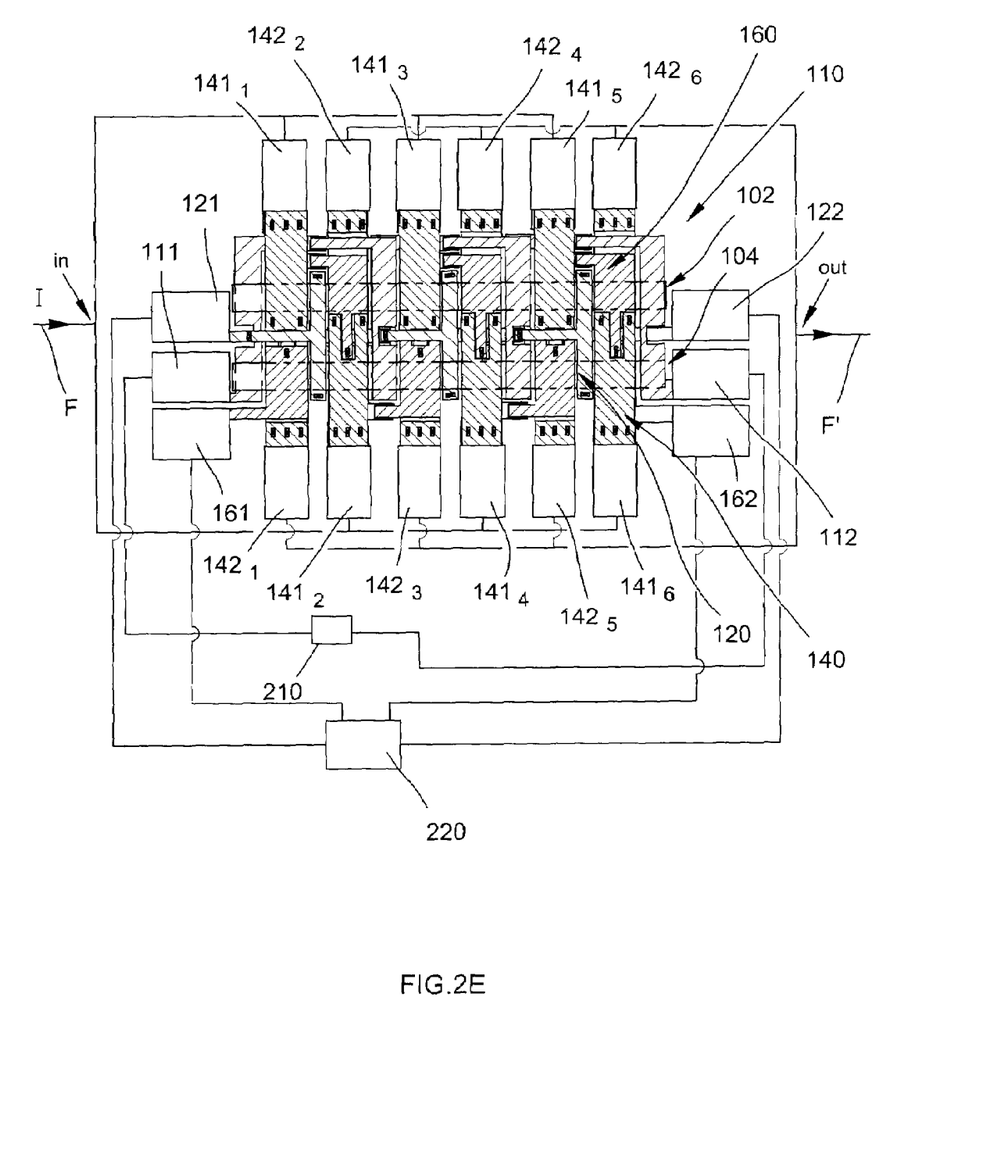
Figure 3D:
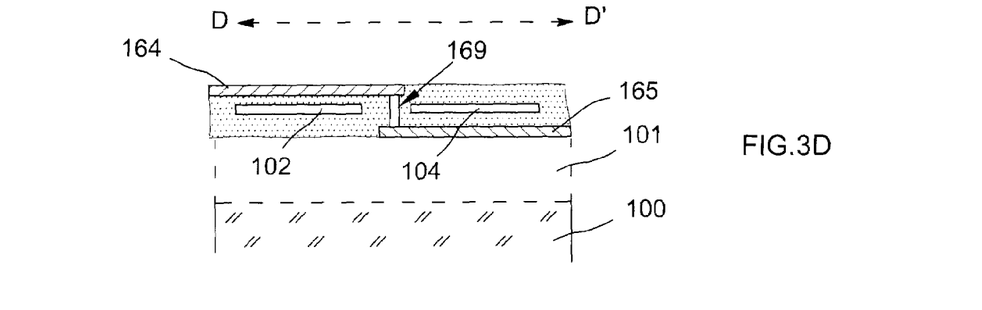

The sensor also comprises a winding 160 (FIGS. 2D and 3D, wherein the other windings 110, 120, 140, are not shown in these figures). The winding 160 comprises a plurality of conductive elements 163 connected or connected to one another in series and positioned along the cores 102 and 104.

The conductive elements 163 may be formed respectively by a first flat conductive zone 164, connected in series to a second flat conductive zone 165, connected in series to a third flat conductive zone 166, connected in series to a fourth flat conductive zone 167. The first flat conductive zone 164 passes opposite the second core 104 and is located in the first plane. The second flat conductive zone 165 passes opposite the first core 102 and is located in the second plane. The third flat conductive zone 166 passes opposite the first core 102 and is located in the first plane. The fourth flat conductive zone 167 passes opposite the second core 104 and is located in the second plane. Vias 169 may allow a conductor element to be connected to a following conductor element of the winding 160, and flat conductive zones 164, 165, 166, 167 of a conductor element to another flat conductive zone of the winding 160 (FIG. 3D showing a transversal cross sectional view D'D shown in FIG. 2D of the winding primary). In the "high current measurement" configuration, the winding 160 acts as the counter reaction winding. The winding 160 is connected by means of conductor pins 161 and 162 at the counter reaction circuit 220 (shown in FIG. 2E). A counter reaction current sent from this circuit 220 is reinjected into the winding 160. Due to the layout of the flat conductive zones, the conductive elements 163 are respectively provided to create a first counter reaction magnetic field component at the first core 102 and at the second core 104, wherein a second counter reaction magnetic field component substantially equal to the first counter reaction magnetic field component, but in the opposite direction to that of the first component.

The winding 160 and the winding 140 are preferably laid out so that, the zones 164, 165, 166, 167, of the winding 160, located opposite the cores 102, 104, are respectively superimposed with the flat conductive zones 145, 144, 146, 147, of the winding 140 located opposite the cores 102, 104. In a region located opposite the cores 102, 104, the zones 164, 165, 166, 167, of the winding 160, and the flat conductive zones 145, 144, 146, 147, of the winding 140 may have equal surfaces S (measured in the plane [O; $\vec{i}$ ; $\vec{j}$ ]). The counter reaction current may thus exactly compensate the local field produced by each subdivision of the current to be measured. In the configuration previously described, the dissipated power for a current of 10 A, may be for example around 50 mW at the current winding 140 and for example around 22 mW at the counter reaction winding 160, wherein the total dissipated power is around 72 mW. The power dissipated by the sensor is lower than that of a shunt which, for example, for a current to be measured of 10 A and a voltage drop of 100 mV dissipates a power of around 1 W.

Figure 4:
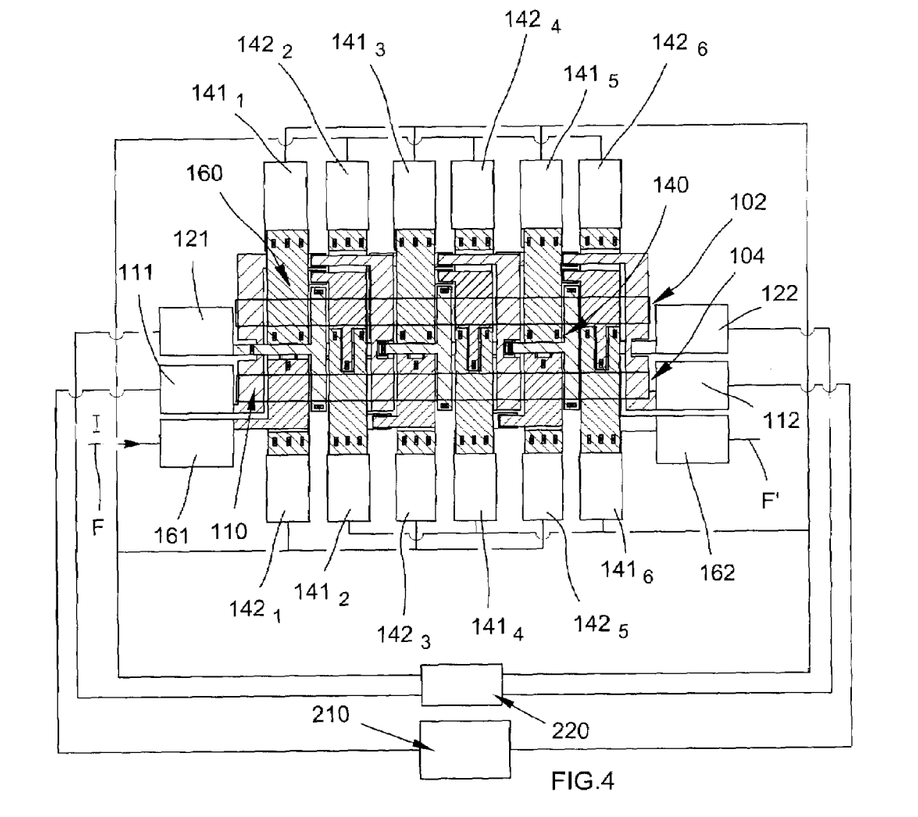
FIG. 4 shows, in a top view, the windings of one example of a current measurement micro sensor of the invention in a low current measurement configuration.

In the case where low currents are to be measured, the "current" and "counter reaction" windings may be inverted. In FIG. 4, the micro current sensor of the invention, is positioned in a second configuration called the <<low current measurement". The winding 160 formed of conductive elements connected in series, acts as the "current winding" through which passes the current I to be measured. The winding 140 formed of conductive elements connected in parallel, this time acts as the counter reaction winding and is connected to the counter reaction circuit 220. Switching means may be provided to pass from the first configuration to the second configuration and vice versa. A FPGA (field programmable gate array) or an ASIC (application specific integrated circuit) or discrete electronic components may permit the management of the switching strategy, to protect the ratings, to implement a zero field counter reaction and possibly command a measurement result display device.

Figure 5:
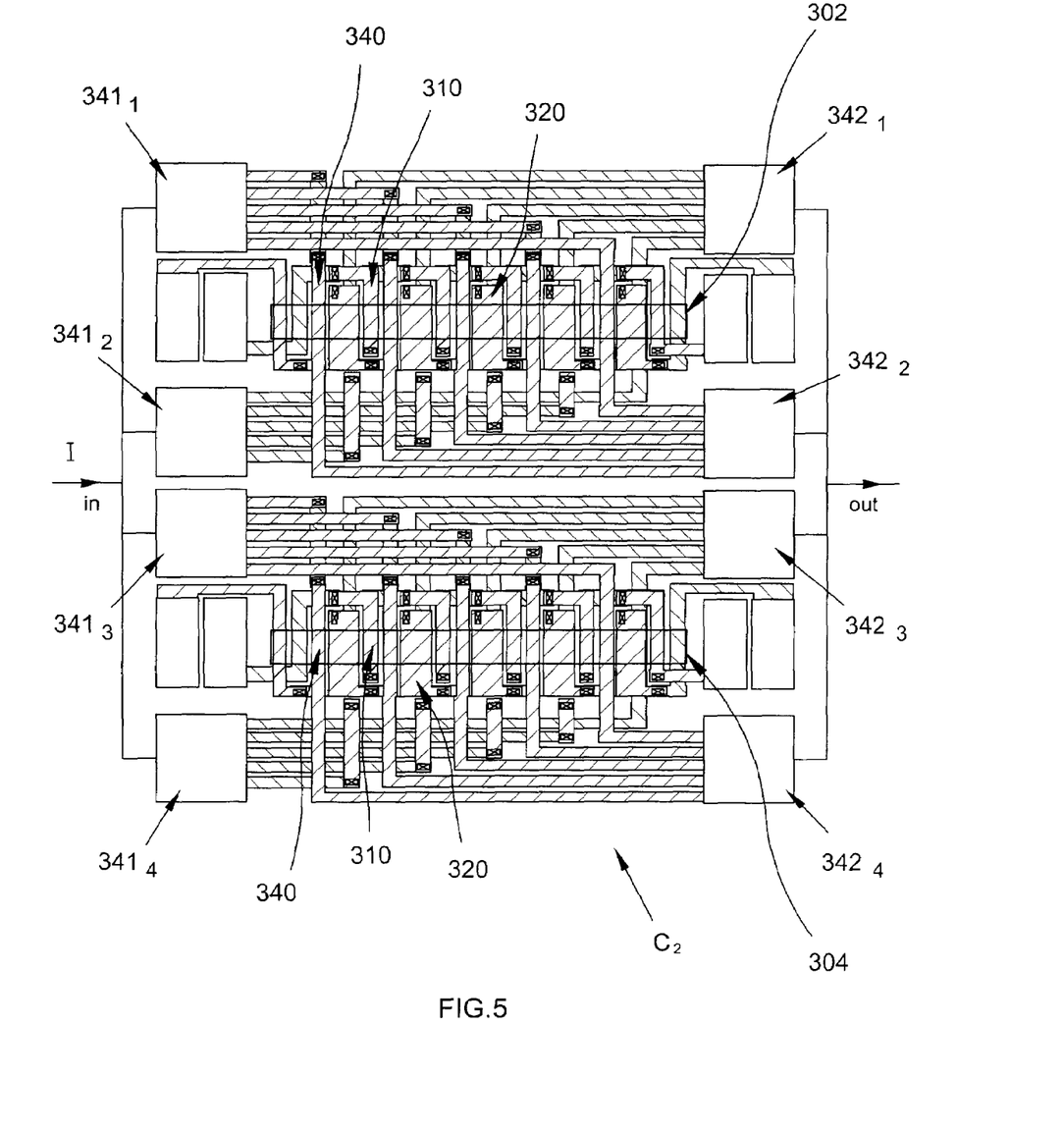
FIG. 5 shows, one variant of a current measurement micro sensor of the invention, for which one winding carries out both the detection and the counter reaction.

In FIG. 5, one variant of embodiment of the sensor of the invention is illustrated. The sensor comprises a magnetic circuit formed by 2 magnetic cores 302, 304, in the form of 2 parallel disjointed arms. For this variant, a winding 320 acts as both the detection and the counter reaction winding. The detection winding 320 may be formed by a plurality of conductive elements connected in series, passing opposite the first core 302 and another plurality of conductive elements connected in series passing opposite the second core 304. The sensor also comprises an excitation winding 310 formed by a plurality of conductive elements connected in series passing opposite the first core 302 and another plurality of conductive elements connected in series passing opposite the second core 304. A current I to be measured is subdivided in equal parts in the pins $341_1$, $341_2$, $341_3$, $341_4$, and passes in a "current" winding 340, then leaves via the pins $342_1$, $342_2$, $342_3$, $342_4$. The current winding 340 comprises a plurality of conductive elements connected in parallel, passing above the first core 304 and connecting a first input pin conductor pin $341_1$ of the current I and a first output conductor pin $342_1$. One plurality of conductive elements connected in parallel, passing above the first core 304 and connecting a second input conductor pin $341_2$ of the current I and a second output conductor pin $342_2$. The current winding 340 also comprises a plurality of conductive elements connected in parallel, passing above the second core 304 and connecting a third input conductor pin $341_3$ of the current I and a third output conductor pin $342_3$, as well as a plurality of conductive elements connected in parallel, passing above the second core 304 and connected to a fourth input conductor pin $341_4$ of the current I and to a fourth output conductor pin $342_4$.

With respect to the embodiment with separate detection and counter reaction windings, this embodiment may be used especially when miniaturisation of the device is preferred with respect to the precision of the measurement.

Figure 7:
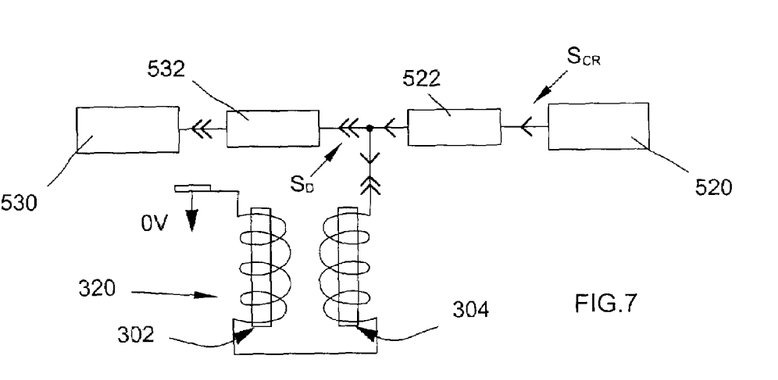

FIG. 7 shows the detection winding 320 (the other windings of the sensor are not shown in this figure) connected to a detection circuit 530 capable of receiving a detection signal $S_D$ from the detection winding and with a counter reaction circuit capable of emitting a detection signal $S_{CR}$ 530 to the detection winding. A high bandwidth filter 532 may be provided between the output of the detection winding 320 and the detection circuit 530, whilst a low bandwidth filter 522 may be provided between the output of the detection winding 320 and the counter reaction circuit 520. At the input of the detection winding, a constant potential for example of 0 volt may be applied.

Figure 6A:
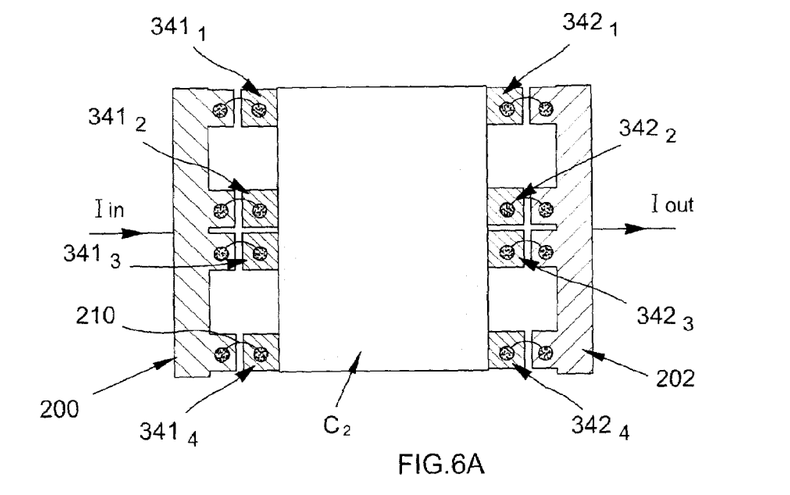
FIGS. 6A-6B show examples of assemblies of a current sensor of the invention with a conductor that a current I to be measured is designed to pass through, FIG. 7 shows, one variant of a current measurement micro sensor of the invention, for which one winding carries out both the detection and the counter reaction, and which is connected to a detection circuit and to a counter reaction circuit, Identical, similar or equivalent parts of the various figures bear the same numerical references so as to make it easier to switch from one figure to another.

FIG. 6A illustrates one example of an assembly of a micro-sensor C2 such as that previously described in relation with FIG. 5, with connectors 200, 202, a rigid or flexible printed circuit capable of allowing strong currents to pass. The sensor is designed to be placed in series in a conductive line or a conductive zone which a current I passes through and that is to be measured. The conductive zone may be assembled by means of the connectors 200, 202 by welding or brazing. The micro sensor is also connected to one or several electronic circuit(s) or an ASIC (specific application integrated circuit) provided to carry out the excitation and detection functions).

Figure 6B:
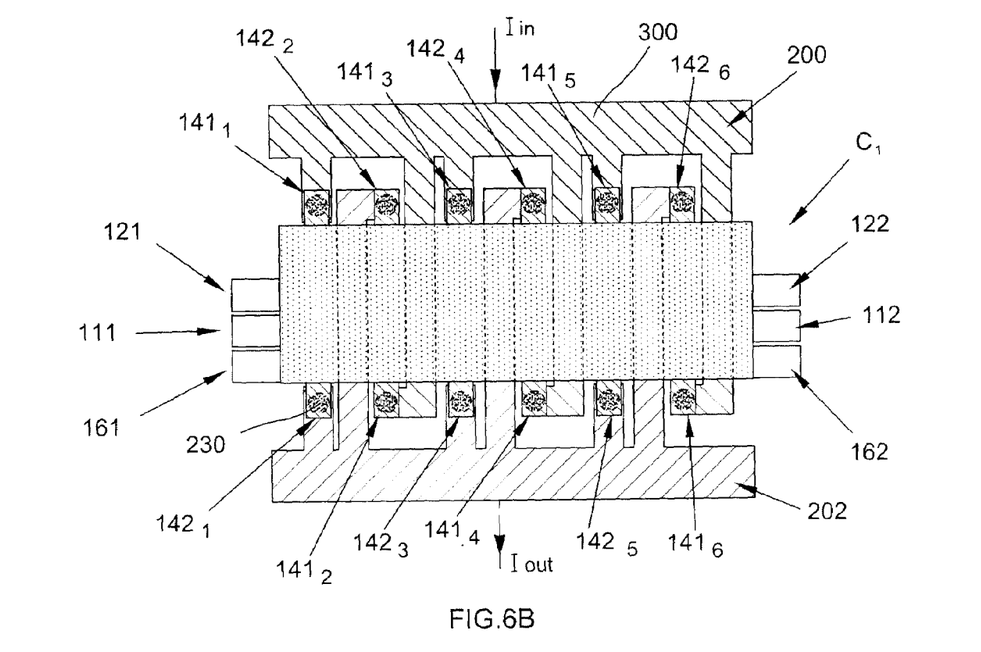

In FIG. 6A, the input pins $341_1$, ..., $341_4$ and the output pins $342_1$, ..., $342_6$ at the input of the winding primary 340 are respectively connected to the connectors 200, 202, by means of wire bonding 210, for example gold wires. The pins of the other windings 310, 320, (not shown in FIG. 6A) are connected to the electronic circuit(s) the ASIC. FIG. 6B illustrates one example of an assembly of a micro-sensor C1 such as that described in relation to FIG. 2E, with connectors 200, 202, a rigid or flexible printed circuit capable of allowing strong currents to pass. The sensor C1 is designed to be placed in series in a conductive line or a conductive zone which a current I passes through and that is to be measured. The conductive zone may be assembled by means of connectors 200, 202 by welding or brazing. The micro sensor is also connected to one or several electronic circuit(s) or an ASIC (specific application integrated circuit) provided to carry out the excitation and detection functions.

In FIG. 6B, the input pins $141_1, \ldots, 141_6$ and the output pins $142_1, \ldots, 142_6$ at the input of the primary winding 140 are respectively connected to the connectors 200, 202 by means of conductive alloy balls 230 for example flip chip technique. Symmetry at the pins, connections, current supply lines, welds or brazing of the sensor, is preferably respected in order to balance optimally the subdivision of the current to be measured, to homogenise optimally the field created by the current to be measured, to compensate this current as accurately as possible and thus to estimate the current to be measured without introducing any static offset, or time drift, or dynamic error into the output signal.

The invention claimed is:

1. Current measurement device equipped with at least one current sensor comprising: one magnetic circuit, as well as a plurality of windings opposite the magnetic circuit of which:
   at least one excitation winding charged with the excitation of the magnetic circuit,
   at least one "current" winding, which a current I to be measured is designed to pass through and which is capable of producing a given magnetic field,
   at least one detection winding,
   at least one "counter reaction" winding, separate from the detection winding and designed to produce a counter reaction magnetic field opposing the given magnetic field,
   among said counter reaction and current windings of the sensor is at least one first winding comprising a first plurality of conductive zones located opposite the magnetic circuit and connected to one another in parallel, coupled by magnetic coupling to at least one second winding comprising one second plurality of conductive zones located opposite the magnetic circuit and connected to one another in series.

2. Current measurement device equipped with at least one current sensor comprising a magnetic circuit, as well as a plurality of windings opposite the magnetic circuit of which:
   at least one excitation winding charged with the excitation of the magnetic circuit,
   at least one "current" winding, which a current I to be measured is designed to pass through and which is capable of producing a given magnetic field,
   at least one detection winding, wherein the detection winding further acts as a counter reaction winding, designed to produce a counter reaction magnetic field opposing the given magnetic field,
   among said counter reaction and current windings of the sensor, is at least one first winding comprising a first plurality of conductive zones located opposite the magnetic circuit and connected to one another in parallel, coupled by magnetic coupling to at least one second winding comprising one second plurality of conductive zones located opposite the magnetic circuit and connected to one another in series.

3. Current measurement device according to claim 1 or 2, in which at least several conductive zones of the first plurality of conductive zones are respectively located opposite a conductive zone of the same surface belonging to the second plurality of conductive zones.

4. Current measurement device according to claim 1 or 2, capable of adopting a "high current measurements" configuration in which said first winding acts as the "current winding" winding and in which said second winding acts as the "counter reaction winding".

5. Current measurement device according to claim 1, capable of adopting a "low current measurement" configuration in which said first winding acts as the "counter reaction winding" and in which said second winding acts as the "current winding".

6. Current measurement device according to claim 5, further comprising: switching means capable of switching the device between a "low current measurements" configuration and a "high current measurements" configuration.

7. Current measurement device according to claim 1, wherein the magnetic circuit is formed by at least one first magnetic core and at least one second magnetic core parallel to the first core.

8. Current measurement device according to claim 7, wherein the layout of the excitation winding is provided so as to produce, one first excitation field component of a given direction at the first core, and one second excitation field component with the same direction as the direction given at the second core.

9. Current measurement device according to claim 1, in which the excitation winding comprises one plurality of conductive zones located opposite the magnetic circuit and connected to one another in series.

10. Current measurement device according to claim 9, in which the layout of the detection winding is provided to carry out a differential measurement between one magnetic field at the first core and one magnetic field at the second core.

11. Current measurement device according to claim 1, in which the detection winding is formed by a plurality of conductive rings connected to one another, wherein the magnetic circuit is located inside at least several of said rings.

12. Current measurement device according to claim 11, further comprising a counter reaction electronic circuit connected to the detection winding and capable of supplying a counter reaction current to the counter reaction winding.

13. Current measurement device according to claim 12, further comprising: an excitation circuit capable of supplying an excitation signal at the input of the excitation winding.

14. Current measurement device according to claim 13, wherein the excitation circuit comprises pulse generating means capable of emitting the excitation signal at the input of the excitation winding in the form of a succession of current pulses.

15. Microelectronic device comprising a device according to claim 14.

* * * * *